United States Patent
Nagahara et al.

(10) Patent No.: US 8,120,127 B2
(45) Date of Patent: Feb. 21, 2012

(54) MAGNETIC RANDOM ACCESS MEMORY AND METHOD OF MANUFACTURING THE SAME

(75) Inventors: Kiyokazu Nagahara, Tokyo (JP); Shunsuke Fukami, Tokyo (JP); Tetsuhiro Suzuki, Tokyo (JP); Norikazu Ohshima, Tokyo (JP); Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 170 days.

(21) Appl. No.: 12/670,462

(22) PCT Filed: Jul. 7, 2008

(86) PCT No.: PCT/JP2008/062300
§ 371 (c)(1), (2), (4) Date: Feb. 24, 2010

(87) PCT Pub. No.: WO2009/019949
PCT Pub. Date: Feb. 12, 2009

(65) Prior Publication Data
US 2010/0193889 A1    Aug. 5, 2010

(30) Foreign Application Priority Data

Aug. 3, 2007 (JP) ................................. 2007-203669
Dec. 14, 2007 (JP) ................................. 2007-323296

(51) Int. Cl.
*H01L 29/78* (2006.01)
(52) U.S. Cl. ................ 257/421; 257/E29.323; 365/158; 365/171; 365/173
(58) Field of Classification Search .................. 257/421, 257/E29.323; 365/158, 171, 173
See application file for complete search history.

(56) References Cited

U.S. PATENT DOCUMENTS

| | | | |
|---|---|---|---|
| 5,640,343 A | 6/1997 | Gallagher et al. | |
| 5,793,697 A * | 8/1998 | Scheuerlein | 365/230.07 |
| 6,055,179 A | 4/2000 | Koganei et al. | |
| 6,545,906 B1 | 4/2003 | Savtchenko et al. | |
| 6,834,005 B1 | 12/2004 | Parkin | |
| 2003/0072174 A1 * | 4/2003 | Savtchenko et al. | 365/158 |

FOREIGN PATENT DOCUMENTS

JP   2001257395 A   9/2001

(Continued)

OTHER PUBLICATIONS

J. C. Slonczewski, "Current-driven excitation of magnetic multilayers", Journal Magnetism and Magnetic Materials, 159, L1-L7, 1996.

(Continued)

Primary Examiner — Jack Chen

(57) ABSTRACT

A domain wall motion type MRAM 100 has: a magnetic recording layer 10 that is a ferromagnetic layer; and a magnetic coupling layer 20 that is a ferromagnetic layer whose magnetization direction is fixed. The magnetic recording layer 10 has: a first region 10-1; a second region 10-2; and a magnetization switching region 10-3 connecting between the first region 10-1 and the second region 10-2. The first region 10-1 is magnetically coupled to the magnetic coupling layer 20 and its magnetization direction is fixed in a first direction by the magnetic coupling layer 20. The second region 10-2 is not magnetically coupled to the magnetic coupling layer 20 and its magnetization direction is a second direction that is opposite to the first direction.

9 Claims, 14 Drawing Sheets

FOREIGN PATENT DOCUMENTS

| | | |
|---|---|---|
| JP | 2003045010 A | 2/2003 |
| JP | 2003110094 A | 4/2003 |
| JP | 2004179183 A | 6/2004 |
| JP | 2005505889 A | 2/2005 |
| JP | 2005123617 A | 5/2005 |
| JP | 2005150303 A | 6/2005 |
| JP | 2005235250 A | 9/2005 |
| JP | 2006093578 A | 4/2006 |
| JP | 2006270069 A | 10/2006 |
| JP | 2006287081 A | 10/2006 |
| JP | 2007258460 A | 10/2007 |
| JP | 2007317895 A | 12/2007 |
| WO | 2005069368 A | 7/2005 |
| WO | 2006046591 A | 5/2006 |
| WO | 2007020823 A | 2/2007 |

OTHER PUBLICATIONS

A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1~4.

A. Yamaguchi et al., "Reduction of Threshold Current Density for Current-Driven Domain Wall Motion using Shape Control", Japanese Journal of Applied Physics, vol. 45, No. 5A, pp. 3850-3853, 2006.

A. Thiaville et al., "Micromagnetic understanding at current-driven domain wall motion in patterned nanowires", Europhysics Letters, vol. 69, pp. 990-996, Mar. 15, 2005.

S. Imada et al., "Perpendicular magnetization of L10-ordered FePi films in the thinnest limit", Applied Physics Letters, vol. 90, pp. 132507-1~3, 2007.

N. Sakimura et al., "MRAM Cell Technology for Over 500MHz SoC", 2006 Symposium on VLSI Circuits, Digest of Technical Papers, pp. 136-137.

C. Platt et al., "Structural and magnetic properties of CoCrPt perpendicular media grown on different buffer layers", Journal of Magnetism and Magnetic Materials, 247, 2002, pp. 153-158.

H. Numata et al., "Magnetic Configuration of A New Memo Cell Utilizing Domain Wall Motion", Intermag 2006 Digest, HQ-03, 2006, p. 933.

D. Ravelosona et al., "Threshold currents to move domain walls in films with perpendicular anisotropy", Applied Physics Letters, vol. 90, 072508, 2007.

D.D. Djayaprawira et al., "230% room-temperature magnetoresistance in CoFeB/MgO/CoFeB magnetic tunnel junctions", Applied Physics Letters, vol. 86, 092502, 2005.

\* cited by examiner

MAGNETIC RANDOM ACCESS MEMORY AND METHOD OF MANUFACTURING THE SAME

TECHNICAL FIELD

The present invention relates to a magnetic random access memory (MRAM: Magnetic Random Access Memory). In particular, the present invention relates to a domain wall motion type MRAM.

BACKGROUND ART

In recent years, an MRAM that utilizes magnetoresistance effect is proposed as one of nonvolatile memories. In particular, an MRAM using an MTJ (Magnetic Tunnel Junction) that exhibits great magnetoresistance effect is actively developed.

A typical MTJ has a laminated structure in which a nonmagnetic insulating layer (hereinafter referred to as a "tunnel barrier layer") is sandwiched between a first ferromagnetic layer and a second ferromagnetic layer. At a time when a current flows in a direction perpendicular to a film surface of the laminated structure, an electric resistance of the MTJ varies depending on a relative angle between respective magnetizations (magnetic moments) of the two ferromagnetic layers. More specifically, the electric resistance takes the minimum value in a state where the respective magnetizations are parallel to each other, while it takes the maximum value in a state where they are anti-parallel to each other. The variation in the resistance value is called "TMR (Tunneling Magneto Resistance) effect".

In the MRAM, an element (TMR element, MTJ element) having such a MTJ is used as a memory cell, and the high and low resistance values of the MTJ are related to data "1" and "0". Data read is achieved by detecting the resistance value of the MTJ. On the other hand, data write is achieved by switching the magnetization state of the two ferromagnetic layers between the "parallel state" and the "anti-parallel state". In general, the magnetization direction of one of the two ferromagnetic layers is fixed, and the data write is achieved by reversing the magnetization of the other thereof. The former is called a "pinned layer (magnetization fixed layer)", and the latter is called a "free layer (magnetization free layer)" or a "recording layer".

Conventionally known methods of the data write to the MRAM include an "asteroid method" (refer, for example, to U.S. Pat. No. 5,640,343) and a "toggle method" (refer, for example, to U.S. Pat. No. 6,545,906 and Japanese Patent Publication JP-2005-505889A). According to these write methods, a magnetic switching field necessary for switching the magnetization of the free layer increases in substantially inverse proportion to a size of the memory cell. That is to say, a write current tends to increase with miniaturization of the memory cell.

As a write method capable of suppressing the increase in the write current with the miniaturization, there is proposed a "spin transfer method" (refer, for example, to Japanese Patent Publication JP-2005-93488A and J. C. Slonczewski, "Current-driven excitation of magnetic multilayers", Journal of Magnetism and Magnetic Materials, 159, L1-L7, 1996). According to the spin transfer method, a spin-polarized current is injected to a ferromagnetic conductor, and direct interaction between spin of conduction electrons of the current and magnetic moment of the conductor causes the magnetization to be switched (hereinafter referred to as "spin transfer magnetization switching"). Here, it is known that a threshold value of the spin transfer magnetization switching depends on "current density". Therefore, the write current necessary for the magnetization switching decreases with the reduction of the size of the memory cell.

In a case where the spin transfer method is applied to the MTJ, the write current is supplied between the pinned layer and the free layer through the tunnel barrier layer. The magnetization of the free layer can be reversed by the spin transfer (transfer of spin angular momentum) between the pinned layer and the free layer. In this case, however, the write current flows so as to penetrate through the laminated structure of the MTJ, which may deteriorate the tunnel barrier layer.

There is also proposed a method that supplies an in-plane write current (for example, Japanese Patent Publication JP-2005-191032A and Japanese Patent Publication JP-2006-073930A). The method will be described with reference to FIG. 1.

In FIG. 1, a magnetoresistance effect element has a magnetic recording layer 110, a pinned layer 112 and a tunnel barrier layer 111 sandwiched between the magnetic recording layer 110 and the pinned layer 112. The magnetic recording layer 110 has a first magnetization fixed region 110-1, a second magnetization fixed region 110-2 and a magnetization switching region 110-3. The magnetization switching region 110-3 overlaps with the pinned layer 112 to form an MTJ together with the tunnel barrier layer 111 and the pinned layer 112.

The first magnetization fixed region 110-1 is connected to a first boundary B1 of the magnetization switching region 110-3. On the other hand, the second magnetization fixed region 110-2 is connected to a second boundary B2 of the magnetization switching region 110-3. The magnetizations of the first magnetization fixed region 110-1 and the second magnetization fixed region 110-2 are fixed in the opposite directions. In FIG. 1 for example, the magnetization of the first magnetization fixed region 110-1 is fixed in the −X-direction, and the magnetization of the second magnetization fixed region 110-2 is fixed in the +X-direction.

Whereas, the magnetization of the magnetization switching region 110-3 is reversible and can be directed toward the first boundary B1 or the second boundary B2. As a result, a domain wall (domain wall) DW is formed at the first boundary B1 or the second boundary B2 in the magnetic recording layer 10. In FIG. 1, the magnetization direction of the magnetization switching region 110-3 is the +X-direction and thus the domain wall DW is formed at the first boundary B1. The data "1" or "0" is determined depending on the relationship between the magnetization direction of the magnetization switching region 110-3 and the magnetization direction of the pinned layer 112.

Also, as shown in FIG. 1, a first interconnection 131 is connected to the first magnetization fixed region 110-1 through a first contact 132, and a second interconnection 134 is connected to the second magnetization fixed region 110-2 through a second contact 133. In the data write operation, a write current is supplied between the first interconnection 131 and the second interconnection 134. That is, the write current flows within a plane in which the magnetic recording layer 110 is formed and thus does not penetrate through the tunnel barrier layer 111.

For example, in the state shown in FIG. 1, the write current flows from the second interconnection 134 to the first interconnection 131 through the magnetic recording layer 110. In this case, electrons are injected from the first magnetization fixed region 110-1 into the magnetization switching region 110-3 through the first boundary B1. Since the spin electrons of the first magnetization fixed region 110-1 are injected into the magnetization switching region 110-3, the magnetization of the magnetization switching region 110-3 is reversed in the −X-direction due to the spin transfer. As a result, the domain wall DW is formed at the second boundary B2. In other words, the domain wall DW moves from the first boundary B1 to the second boundary B2 through the magnetization switching region 110-3 due to the in-plane write current.

On the other hand, in a case where the write current flows from the first interconnection 131 to the second interconnection 134 through the magnetic recording layer 110, the domain wall DW moves from the second boundary B2 to the first boundary B1 through the magnetization switching region 110-3. As a result, the magnetization of the magnetization switching region 110-3 is reversed in the +X-direction.

In this manner, the domain wall DW in the magnetic recording layer 110 moves between the first boundary B1 and the second boundary B2 due to the current flowing between the first magnetization fixed region 110-1 and the second magnetization fixed region 110-2. This phenomenon is called "current-driven domain wall motion". The data write method utilizing the current-driven domain wall motion is called a "domain wall motion method". The domain wall motion type MRAM is characterized by suppressing the deterioration of the tunnel barrier layer 111. Moreover, since the data write is achieved based on the spin transfer method, the write current can be reduced with the reduction of the size of the memory cell.

DISCLOSURE OF THE INVENTION

As described above, according to the domain wall motion type MRAM shown in FIG. 1, the data write is achieved by the current-driven domain wall motion. It should be noted that in order to achieve the current-driven domain wall motion, the respective magnetizations of the first magnetization fixed region 110-1 and the second magnetization fixed region 110-2 need to be fixed in the opposite directions. However, to fix magnetizations in the opposite directions in the same plane is generally difficult.

An object of the present invention is to provide a technique that can easily and stably fix the magnetization in a domain wall motion type MRAM.

In an aspect of the present invention, a domain wall motion type magnetic random access memory is provided. The magnetic random access memory has: a magnetic recording layer that is a ferromagnetic layer; and a magnetic coupling layer that is a ferromagnetic layer whose magnetization direction is fixed. The magnetic recording layer has: a first region; a second region; and a magnetization switching region connecting between the first region and the second region. The first region is magnetically coupled to the magnetic coupling layer and its magnetization direction is fixed in a first direction by the magnetic coupling layer. The second region is not magnetically coupled to the magnetic coupling layer and its magnetization direction is a second direction that is opposite to the first direction.

In another aspect of the present invention, a method of manufacturing a domain wall motion type magnetic random access memory is provided. The method includes the steps of: forming a magnetic coupling layer that is a ferromagnetic layer; forming a magnetic recording layer that is a ferromagnetic layer; fixing a magnetization direction of the magnetic coupling layer by applying a first external magnetic field and performing heat treatment, wherein only a first region in the magnetic recording layer is magnetically coupled to the magnetic coupling layer and a magnetization direction of the first region is fixed in a first direction by the magnetic coupling layer; and generating a domain wall in the magnetic recording layer by applying a second external magnetic field along a second direction opposite to the first direction, after the above-mentioned fixing the magnetization direction.

According to the present invention, it is possible to easily and stably fix the magnetization in the domain wall motion type MRAM. Therefore, production costs are reduced and reliability is improved.

BRIEF DESCRIPTION OF DRAWINGS

Objects, effects and features of the present invention will be more apparent from the following description of certain embodiments taken in conjunction with the attached drawings.

BEST MODE FOR CARRYING OUT THE INVENTION

Exemplary embodiments of the present invention will be described below with reference to the attached drawings. According to the exemplary embodiments of the present invention, a "domain wall motion type MRAM" is provided. The MRAM has a plurality of memory cells which are arranged in an array form, and each memory cell has a magnetoresistance effect element which exhibits the magnetoresistance effect. In the exemplary embodiments described below, the magnetoresistance effect element is an MTJ element that exhibits the TMR effect.

1. First Exemplary Embodiment 1-1. Structure

Figure 2:
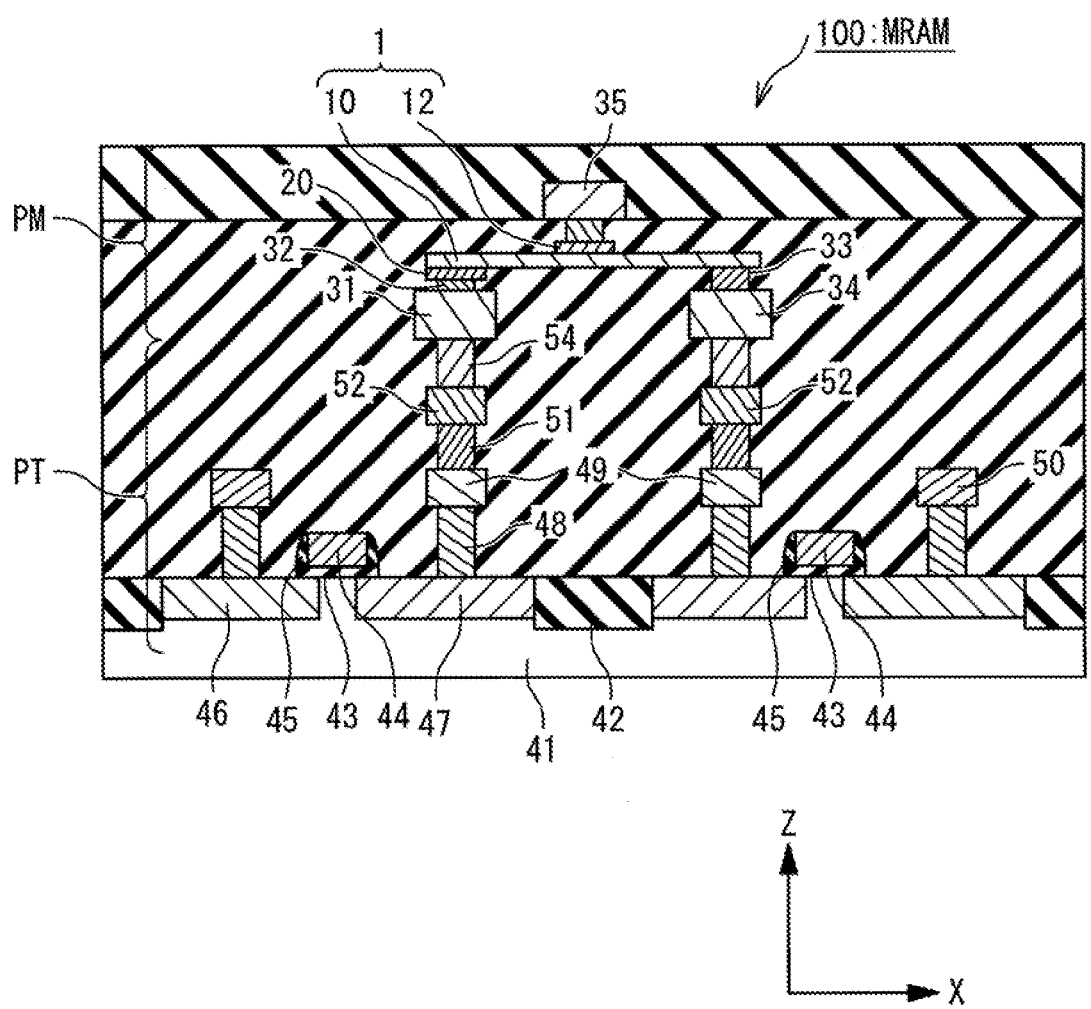
FIG. 2 is a cross-sectional view showing a structure of a domain wall motion type MRAM according to an exemplary embodiment of the present invention.

FIG. 2 shows a cross-sectional structure of a main part of a domain wall motion type MRAM 100 according to a first exemplary embodiment. In particular, an example of a cross-sectional structure of one-bit memory cell is shown in FIG. 2. The memory cell includes a selection transistor part PT and a memory element part PM.

First, the selection transistor part PT will be described. In FIG. 2, a semiconductor substrate 41 is, for example, a p-type silicon substrate (or a p-type well region). A device isolation structure 42 exemplified by an STI (Shallow Trench Isolation) structure is formed in the semiconductor substrate 41. A read selection switch is formed in a region surrounded by the device isolation structure 42.

The read selection switch is constituted by a MOS transistor (e.g. n-channel MOS transistor). More specifically, a gate electrode 44 is formed on the semiconductor substrate 41 through a gate insulating film 43. A side wall 45 is formed on the sided of the gate electrode 44. Diffusion regions 46 and 47 serving as source/drain are formed at a surface of the semiconductor substrate 41 on both sides of the gate electrode 44. The gate electrode 44 extends in the −Y-direction and serves as a read word line for selecting a read target cell at a time of a read operation.

A first metal layer (49, 50) is formed on the semiconductor substrate 41 through an interlayer insulating film. Also, a contact 48 is so formed as to penetrate through the interlayer insulating film. The first metal layer includes a bit line 50 connected to the diffusion region 46 through the contact 48 and an intermediate layer 49 connected to the diffusion region 47 through the contact 48. Moreover, a second metal layer (52) is formed on the first metal layer through an interlayer insulating film. The second metal layer serves as an intermediate layer 52 and is connected to the above-mentioned intermediate layer 49 through a contact 51. Furthermore, a third metal layer (31, 34) is formed on the second metal layer through an interlayer insulating film. The third metal layer is connected to the above-mentioned intermediate layer 52 through a contact 54.

Next, the memory element part PM will be described. In FIG. 2, the memory element part PM has the above-mentioned third metal layer, a magnetoresistance effect element 1 and a read interconnection 35. The third metal layer includes a first interconnection 31 and a second interconnection 34, and is electrically connected to the magnetoresistance effect element 1. The first interconnection 31 and second interconnection 34 serve as a write word line for supplying a write current to the magnetoresistance effect element 1. On the other hand, the read interconnection 35 also is electrically connected to the magnetoresistance effect element 1. A read current flows through the read interconnection 35 in the data read operation.

Figure 3:
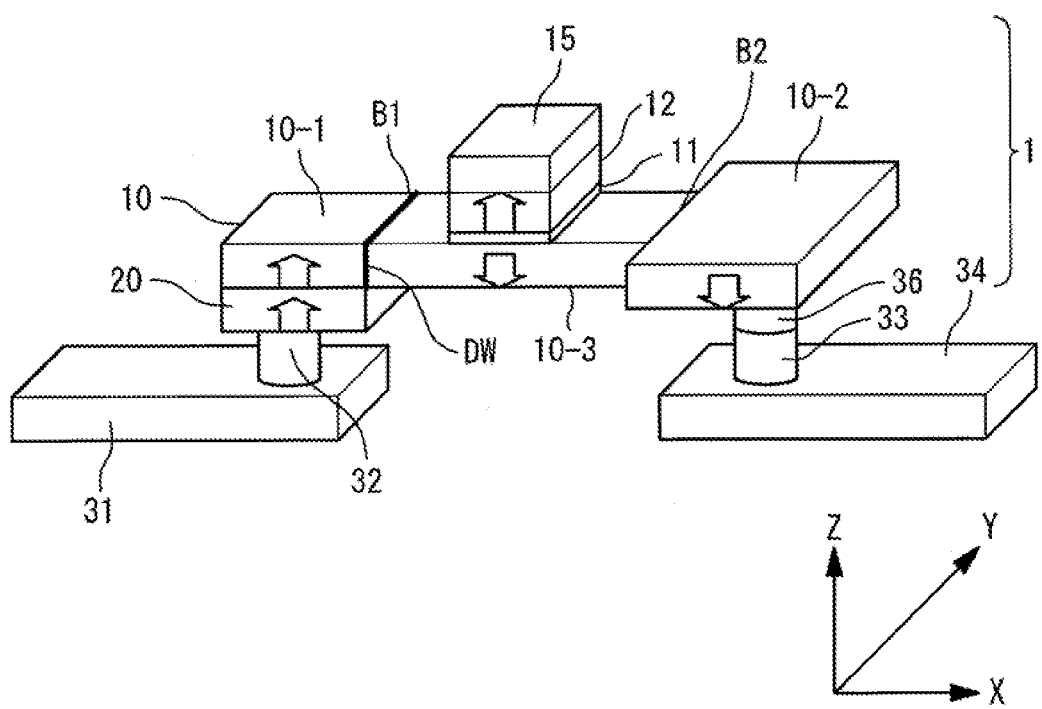
FIG. 3 is a schematic view showing a structure of a memory element part in a first exemplary embodiment.

FIG. 3 shows in more detail the structure of the memory element part PM according to the present exemplary embodiment. As shown in FIG. 3, the memory element part PM has the magnetoresistance effect element 1, a magnetic coupling layer 20, the first interconnection 31 and the second interconnection 34.

The magnetoresistance effect element 1 has a magnetic recording layer 10 that is a ferromagnetic layer, a tunnel barrier layer 11 that is a nonmagnetic layer, a pinned layer 12 that is a ferromagnetic layer and an anti-ferromagnetic layer 15. The magnetic recording layer 10 and the pinned layer 12 are connected to each other through the tunnel barrier layer 11. In other words, the tunnel barrier layer 11 is sandwiched between the magnetic recording layer 10 and the pinned layer 12, and the magnetic recording layer 10, the tunnel barrier layer 11 and the pinned layer 12 form an MTJ (Magnetic Tunnel Junction). The tunnel barrier layer 11 is a thin insulating film such as an alumina oxide film (Al-Ox) obtained by oxidizing an Al film, a magnesium oxide (MgO) film and the like.

The magnetic recording layer 10 and the pinned layer 12 each is a ferromagnetic film made of iron (Fe), cobalt (Co), nickel (Ni), or alloy containing at least one of them. Particularly, in the present exemplary embodiment, the magnetic recording layer 10 and the pinned layer 12 each has "perpendicular magnetic anisotropy". The ferromagnetic film having the perpendicular magnetic anisotropy is hereinafter referred to as a "perpendicular magnetic film". The magnetization direction of the perpendicular magnetic film is substantially perpendicular to a plane in which the film is formed, namely, parallel to the normal direction of the film. In FIG. 3 for example, the magnetic recording layer 10 and the pinned layer 12 are formed parallel to the XY-plane and the magnetization thereof is substantially directed to the +Z-direction or the −Z-direction.

In a case where the perpendicular magnetic film contains Pt or Pd, the perpendicular magnetic anisotropy is more stabilized, which is preferable. In addition to that, it is possible to make the perpendicular magnetic film exhibit desired magnetic characteristics by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm or the like. Therefore, material of the magnetic recording layer 10 and the pinned layer 12 includes Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co and the like. Alternatively, a layer containing at least one material selected from Fe, Co and Ni and another layer may form a laminated structure. In this case, the laminated structure is exemplified by Co/Pd, Co/Pt, Fe/Au and the like.

The anti-ferromagnetic layer 15 is stacked on the pinned layer 12 and plays a role of fixing the magnetization direction of the pinned layer 12. More specifically, the magnetization of the pinned layer 12 is fixed in one direction by exchange interaction between the pinned layer 12 and the anti-ferromagnetic layer 15. In the example shown in FIG. 3, the magnetization of the pinned layer 12 is fixed in the +Z-direction. Material of the anti-ferromagnetic layer 15 includes manganess alloy such as FeMn, PtMn and NiMn and metal oxide such as CoO and NiO.

As shown in FIG. 3, the magnetic recording layer 10 according to the present exemplary embodiment has three different regions: a first magnetization fixed region 10-1, a second magnetization fixed region 10-2 and a magnetization switching region 10-3. The magnetization switching region 10-3 extends along the X-axis so as to connect between the first magnetization fixed region 10-1 and the second magnetization fixed region 10-2. The first magnetization fixed region 10-1 and the second magnetization fixed region 10-2 are respectively formed on both sides of the magnetization switching region 10-3. More specifically, the first magnetization fixed region 10-1 and the magnetization switching region 10-3 are in contact with each other at a first boundary B1, and the second magnetization fixed region 10-2 and the magnetization switching region 10-3 are in contact with each other at a second boundary B2. The first boundary B1 and the second boundary B2 correspond to both side surfaces of the magnetization switching region 10-3 which face each other and intersect with the X-axis.

The first magnetization fixed region 10-1, the second magnetization fixed region 10-2 and the magnetization switching region 10-3 are formed in the same plane (XY-plane). The magnetization switching region 10-3 among them overlaps with the above-mentioned pinned layer 12. In other words, the magnetization switching region 10-3 as a part of the magnetic recording layer 10 is connected to the pinned layer 12 through the tunnel barrier layer 11 and plays a part of the MTJ.

An example of the magnetization direction in each region is also indicated by an arrow in FIG. 3. The magnetization directions of the first magnetization fixed region 10-1 and the second magnetization fixed region 10-2 are fixed. In particular, the magnetization of the first magnetization fixed region 10-1 and the magnetization of the second magnetization fixed region 10-2 are fixed in the opposite directions (anti-parallel to each other). Since the magnetic recording layer 10 in the present exemplary embodiment has the perpendicular magnetic anisotropy as described above, the magnetizations of the first magnetization fixed region 10-1 and the second magnetization fixed region 10-2 are fixed in the opposite directions along the Z-direction. In the example shown in FIG. 3, the magnetization of the first magnetization fixed region 10-1 is fixed in the +Z-direction and the magnetization of the second magnetization fixed region 10-2 is fixed in the −Z-direction.

On the other hand, the magnetization switching region 10-3 has reversible magnetization. That is, the magnetization direction of the magnetization switching region 10-3 is allowed to be the +Z-direction or the −Z-direction. In the example shown in FIG. 3, the magnetization direction of the magnetization switching region 10-3 is the −Z-direction. In this case, the second magnetization fixed region 10-2 and the magnetization switching region 10-3 form one magnetic domain, and the first magnetization fixed region 10-1 forms another magnetic domain. Therefore, a domain wall DW is formed at the first boundary B1. On the other hand, in a case where the magnetization direction of the magnetization switching region 10-3 is the +Z-direction, the first magnetization fixed region 10-1 and the magnetization switching region 10-3 form one magnetic domain, and the second magnetization fixed region 10-2 forms another magnetic domain. Therefore, the domain wall DW is formed at the second boundary B2. In this manner, the domain wall DW is formed at the first boundary B1 or the second boundary B2 in the magnetic recording layer 10.

Here, let us consider the case where the magnetization direction of the above-mentioned pinned layer 12 is fixed in the +Z-direction. When the magnetization direction of the magnetization switching region 10-3 is the −Z-direction, namely, when the domain wall DW is formed at the first boundary B1, the magnetizations of the pinned layer 12 and the magnetization switching region 10-3 are anti-parallel to each other. This anti-parallel state corresponds to a state where the resistance value of the MTJ becomes relatively large, which is related to data "1" for example. On the other hand, when the magnetization direction of the magnetization switching region 10-3 is the +Z-direction, namely, when the domain wall DW is formed at the second boundary B2, the magnetizations of the pinned layer 12 and the magnetization switching region 10-3 are parallel to each other. This parallel state corresponds to a state where the resistance value of the MTJ becomes relatively small, which is related to data "0" for example. In this manner, the location of the domain wall DW in the magnetic recording layer 10 reflects the data stored in the magnetoresistance effect element 1.

Furthermore, the magnetic recording layer 10 according to the present exemplary embodiment has the following features. That is, a cross-sectional area of the second magnetization fixed region 10-2 is larger than a cross-sectional area of the magnetization switching region 10-3 at the second boundary B2 where the second magnetization fixed region 10-2 and the magnetization switching region 10-3 are in contact with each other. For example, as shown in FIG. 3, a width of the second magnetization fixed region 10-2 along the Y-axis is larger at the second boundary B2 than a width of the magnetization switching region 10-3 along the Y-axis. In other words, the second magnetization fixed region 10-2 is so formed as to be wider than the magnetization switching region 10-3. Note that the width of the second magnetization fixed region 10-2 just needs to be wider than the width of the magnetization switching region 10-3 at least at the second boundary B2. The width of the second magnetization fixed region 10-2 may increase or decrease with increase distance in the X-direction from the second boundary B2.

As described above, the cross-sectional area of the second magnetization fixed region 10-2 is larger in the vicinity of the second boundary B2 than the cross-sectional area of the magnetization switching region 10-3. Therefore, when a current flows between the magnetization switching region 10-3 and the second magnetization fixed region 10-2 through the second boundary B2, the current density in the second magnetization fixed region 10-2 becomes lower than the current density in the magnetization switching region 10-3. This contributes to the prevention of intrusion of the domain wall DW into the second magnetization fixed region 10-2, which will be described later.

Meanwhile, the first magnetization fixed region 10-1 is not necessarily wider than the magnetization switching region 10-3. At the first boundary B1, a cross-sectional area of the first magnetization fixed region 10-1 may be equal to a cross-sectional area of the magnetization switching region 10-3. Instead, the "magnetic coupling layer 20" is provided on the side of the first magnetization fixed region 10-1.

The magnetic coupling layer 20 is a ferromagnetic layer that is magnetically coupled to the first magnetization fixed region 10-1. The magnetic coupling layer 20 plays a role of fixing the magnetization direction of the first magnetization fixed region 10-1. In the example shown in FIG. 3, the magnetic coupling layer 20 is so formed as to be in contact with the lower surface of the first magnetization fixed region 10-1. The magnetization of the magnetic coupling layer 20 is fixed in the +Z-direction. The magnetization of the first magnetization fixed region 10-1 is fixed in the +Z-direction by the magnetization of the magnetic coupling layer 20.

It should be noted in FIG. 3 that one end of the magnetic coupling layer 20 is adjacent to the first boundary B1. In other words, a position aligned with the one end of the magnetic coupling layer 20 for fixing the magnetization direction corresponds to the first boundary B1 that is the boundary between the first magnetization fixed region 10-1 and the magnetization switching region 10-3 in the magnetic recording layer 10. A shape of the magnetic coupling layer 20 in the XY-plane is almost the same as or larger than a shape of the first magnetization fixed region 10-1.

The magnetic coupling layer 20 may be so formed as to be in contact with the upper surface of the first magnetization fixed region 10-1. The magnetic coupling layer 20 may be formed apart from the first magnetization fixed region 10-1. The magnetic coupling layer 20 just needs to be magnetically coupled to the first magnetization fixed region 10-1 so as to fix the magnetization direction of the first magnetization fixed region 10-1 in the +Z-direction. As will be described later, the magnetic coupling layer 20 contributes to the prevention of intrusion of the domain wall DW into the first magnetization fixed region 10-1. Moreover, the magnetic coupling layer 20 plays a role of facilitating fixation of the magnetizations of the magnetization fixed regions (10-1, 10-2) in the magnetic recording layer 10.

According to the present exemplary embodiment, as described above, the magnetic coupling layer 20 is provided only on the side of the first boundary B1 of the magnetization switching region 10-3 while the side of the second boundary B2 is formed to be wider. This can be opposite. That is, it is also possible that the magnetic recording layer 20 is provided only on the side of the second boundary B2 (second magnetization fixed region 10-2) while the first magnetization fixed region 10-1 on the side of the first boundary B1 is formed wider than the magnetization switching region 10-3.

Referring to FIG. 3 again, the first interconnection 31 is connected to the first magnetization fixed region 10-1 of the magnetic recording layer 10 through a first contact 32 and the magnetic coupling layer 20. On the other hand, the second interconnection 34 is connected to the second magnetization fixed region 10-2 of the magnetic recording layer 10 through a second contact 33 and a third contact 36. By supplying a current between the first interconnection 31 and the second interconnection 34, it is possible to supply the in-plane current in the magnetic recording layer 10. The read interconnection 35 shown in FIG. 2 is connected to the anti-ferromagnetic layer 15 through an electrode and the like.

1-2. Data Write Operation/Data Read Operation

Next, a data write operation will be described with reference to FIG. 3. Let us consider a case where a state (the above-mentioned anti-parallel state) where the domain wall DW is formed at the first boundary B1 is related to the data "1" while a state (the above-mentioned parallel state) where the domain wall DW is formed at the second boundary B2 is related to the data "0". The data write operation is performed by supplying the in-plane write current in the magnetic recording layer 10 to move the domain wall DW between the first boundary B1 and the second boundary B2. To that end, a predetermined potential difference is applied between the first interconnection 31 and the second interconnection 34.

At a time of writing the data "0", the write current flows from the second interconnection 34 through the magnetic recording layer 10 into the first interconnection 31. In this case, in the magnetic recording layer 10, electrons flow from the first magnetization fixed region 10-1 into the magnetization switching region 10-3 through the first boundary B1. That is, the +Z-direction spin electrons are injected from the first magnetization fixed region 10-1 into the magnetization switching region 10-3. As a result of the spin transfer due to the spin electrons, the magnetization of the magnetization switching region 10-3 starts to turn over to the +Z-direction beginning at near the first boundary B1. This means that the domain wall DW moves from the first boundary B1 toward the second boundary B2.

The write current continues to flow, and thus the domain wall DW passes through the magnetization switching region 10-3 to reach the second boundary B2. It should be noted here that the cross-sectional area of the second magnetization fixed region 10-2 is larger than the cross-sectional area of the magnetization switching region 10-3 at the second boundary B2. Focusing on the vicinity of the second boundary B2, the current density in the second magnetization fixed region 10-2 becomes lower than the current density in the magnetization switching region 10-3. As described above, it is known that the threshold value of the spin transfer magnetization switching depends on the current density. Therefore, when the domain wall DW reaches the second boundary B2, the domain wall DW hardly moves further.

The threshold current density required for the spin transfer magnetization switching is hereinafter referred to as "depinning current density". In the present exemplary embodiment, the magnitude of the write current and the shape of the magnetization switching region 10-3 are designed such that the current density in the magnetization switching region 10-3 is higher than the depinning current density. On the other hand, the magnitude of the write current and the shape of the second magnetization fixed region 10-2 are designed such that the current density in the second magnetization fixed region 10-2 is lower than the depinning current density. As a result, the domain wall DW moves from the first boundary B1 through the magnetization switching region 10-3 to stop at the second boundary B2. The domain wall DW does not intrude into the second magnetization fixed region 10-2 beyond the second boundary B2. This means that the fixed magnetization in the second magnetization fixed region 10-2 is stable. That is, the fixed magnetization of the second magnetization fixed region 10-2 is stabilized by the unique shape of the magnetic recording layer 10 according to the present exemplary embodiment.

On the other hand, at a time of writing the data "1", the write current flows from the first interconnection 31 through the magnetic recording layer 10 into the second interconnection 34. In this case, in the magnetic recording layer 10, electrons flow from the second magnetization fixed region 10-2 into the magnetization switching region 10-3 through the second boundary B2. That is, the −Z-direction spin electrons are injected from the second magnetization fixed region 10-2 into the magnetization switching region 10-3. As a result of the spin transfer due to the spin electrons, the magnetization of the magnetization switching region 10-3 starts to turn over to the −Z-direction beginning at near the second boundary B2. This means that the domain wall DW moves from the second boundary B2 toward the first boundary B1.

The write current continues to flow, and thus the domain wall DW passes through the magnetization switching region 10-3 to reach the first boundary B1. As described above, the magnetization direction of the first magnetization fixed region 10-1 is fixed in the +Z-direction by the magnetic coupling layer 20. Therefore, the magnetization does not turn over to the −Z-direction beyond the first boundary B1. That is, the domain wall DW moves to the first boundary B1 and stops at the first boundary B1 without intruding into the first magnetization fixed region 10-1 beyond the first boundary B1. This means that the fixed magnetization in the first magnetization fixed region 10-1 is stable. That is, the fixed magnetization of the first magnetization fixed region 10-1 is stabilized by the magnetic coupling layer 20.

As described above, the domain wall DW in the magnetic recording layer 10 moves between the first boundary B1 and the second boundary B2 due to the write current flowing between the first magnetization fixed region 10-1 and the second magnetization fixed region 10-2. That is, the domain wall motion type MRAM100 utilizing the current-driven domain wall motion is achieved. Since the write current does not penetrate through the tunnel barrier layer 11, deterioration of the tunnel barrier layer 11 is suppressed.

A data read operation is as follows. In the data read operation, a read current is so supplied as to flow between the pinned layer 12 and the magnetization switching region 10-3 through the tunnel barrier layer 11. For example, one of the MOS transistors shown in FIG. 2 is turned ON, and the read current flows from the bit line 50 through the ON transistor into the first magnetization fixed region 10-1 or the second magnetization fixed region 10-2 of the magnetic recording layer 10. The read current further penetrates through the MTJ (magnetization switching region 10-3, tunnel barrier layer 11 and pinned layer 12) to flow to the read interconnection 35. By comparing the read current or a read potential depending on the read current with a predetermined reference level, whether the resistance value of the MTJ is large or small is detected. In other words, the magnetization direction (+Z-direction or −Z-direction) of the magnetization switching region 10-3 is sensed and thus the data ("0" or "1") stored in the memory cell is sensed.

1-3. Method of Manufacturing and Method of Fixing Magnetization

Next, a method of manufacturing the structure shown in FIG. 3 will be described with reference to FIG. 4. The first interconnection 31 and the second interconnection 34 are made of low electric resistance material such as aluminum (Al), copper (Cu), tungsten (W) and the like. Subsequently, an insulating layer 55 such as an $SiO_2$ film is so deposited as to cover the first interconnection 31 and the second interconnection 34. After that, contact holes are formed in the insulating layer 55 by reactive ion etching (RIE: Reactive Ion Etching) or the like. The contact holes are filled with copper (Cu), tungsten (W) or the like, and thereby the first contact 32 connected to the first interconnection 31 and the second contact 33 connected to the second interconnection 34 are formed.

Next, a magnetic film to be the magnetic coupling layer 20 is formed on the insulating layer 55 by sputtering or the like. The magnetic film in an unnecessary region is removed by ion milling, and thereby the magnetic coupling layer 20 connected to the first contact 32 is formed. Next, an insulating layer 56 such as an $SiO_2$ film is deposited. Subsequently, the insulating layer 56 over the magnetic coupling layer 20 is completely removed by CMP (Chemical Mechanical Polishing). After that, the third contact 36 penetrating through the insulating layer 56 to be connected to the second contact 33 is formed as in the case of the first contact 32 and the second contact 33.

Next, the magnetic recording layer 10, the tunnel barrier layer 11 and the pinned layer 12 are formed in order by sputtering or the like. Then, the pinned layer 12, the tunnel barrier layer 11 and the magnetic recording layer 10 are processed by ion milling or the like to be respective desired shapes.

In this manner, the magnetic coupling layer 20 and the magnetic recording layer 10 (first magnetization fixed region 10-1) can be electrically and magnetically coupled to each other. Moreover, as a result of the CMP process, surface roughness of a region where the pinned layer 12 and the tunnel barrier layer 11 are formed can be suppressed.

Next, a method of fixing the magnetizations of the magnetization fixed regions (10-1, 10-2) in the magnetic recording layer 10 will be described. This magnetization fixation process corresponds to first generation of the domain wall DW in the magnetic recording layer 10.

After the above-mentioned magnetic coupling layer 20 is formed, fixation (initialization) of the magnetization of the magnetic coupling layer 20 is performed. In the case of the structure shown in FIG. 4, a strong external magnetic field (first external magnetic field) in the +Z-direction is applied. Furthermore, heat treatment is performed under the condition that the first external magnetic field is applied. As a result, the magnetization direction of the magnetic coupling layer 20 is fixed in the +Z-direction. Due to the magnetization of the magnetic coupling layer 20, the magnetization direction of the first magnetization fixed region 10-1 magnetically coupled to the magnetic coupling layer 20 also is fixed in the +Z-direction. The same applies to a case where the magnetic coupling layer 20 is apart from the first magnetization fixed region 10-1. The direction of the first external magnetic field is set such that the magnetization direction of the first magnetization fixed region 10-1 is fixed in the +Z-direction by the magnetization of the magnetic coupling layer 20.

Next, an external magnetic field (second external magnetic field) in the direction opposite to the magnetization direction of the first magnetization fixed region 10-1 is applied. In the case of the structure shown in FIG. 4, the second external magnetic field in the −Z-direction is applied. The magnitude of the second external magnetic field is set to be equal to or larger than that required for magnetization reversal of the magnetic recording layer 10. At the same time, the magnitude of the second external magnetic field is set to be sufficiently smaller than that required for magnetization reversal of the magnetic coupling layer 20. At this time, the heat treatment is not necessarily required.

Due to the application of the second external magnetic field, the magnetization of the magnetic recording layer 10 except for the first magnetization fixed region 10-1 is reversed. The magnetization of the first magnetization fixed region 10-1 is not reversed, because it is fixed by the magnetic coupling layer 20. Therefore, the magnetization of only the second magnetization fixed region 10-2 and the magnetization switching region 10-3 of the magnetic recording layer 10 is directed to the −Z-direction. As a result, the domain wall DW is generated at the first boundary B1 that is the boundary between the first magnetization fixed region 10-1 and the magnetization switching region 10-3. Once the domain wall DW is generated, the domain wall DW never intrudes into the first magnetization fixed region 10-1 and the second magnetization fixed region 10-2 as described above.

In this manner, the magnetizations of the first magnetization fixed region 10-1 and the second magnetization fixed region 10-2 in the same magnetic recording layer 10 can be easily fixed in the opposite directions. The reason is that the magnetic coupling layer 20 is provided only on the side of the first magnetization fixed region 10-1. Even when the second external magnetic field in the opposite direction is applied, the magnetization of the first magnetization fixed region 10-1 is not reversed because of the magnetic coupling with the magnetic coupling layer 20. It is thus possible to reverse the magnetization of the second magnetization fixed region 10-2 while keeping the magnetization direction of the first magnetization fixed region 10-1.

1-4. Effects

Figure 1:
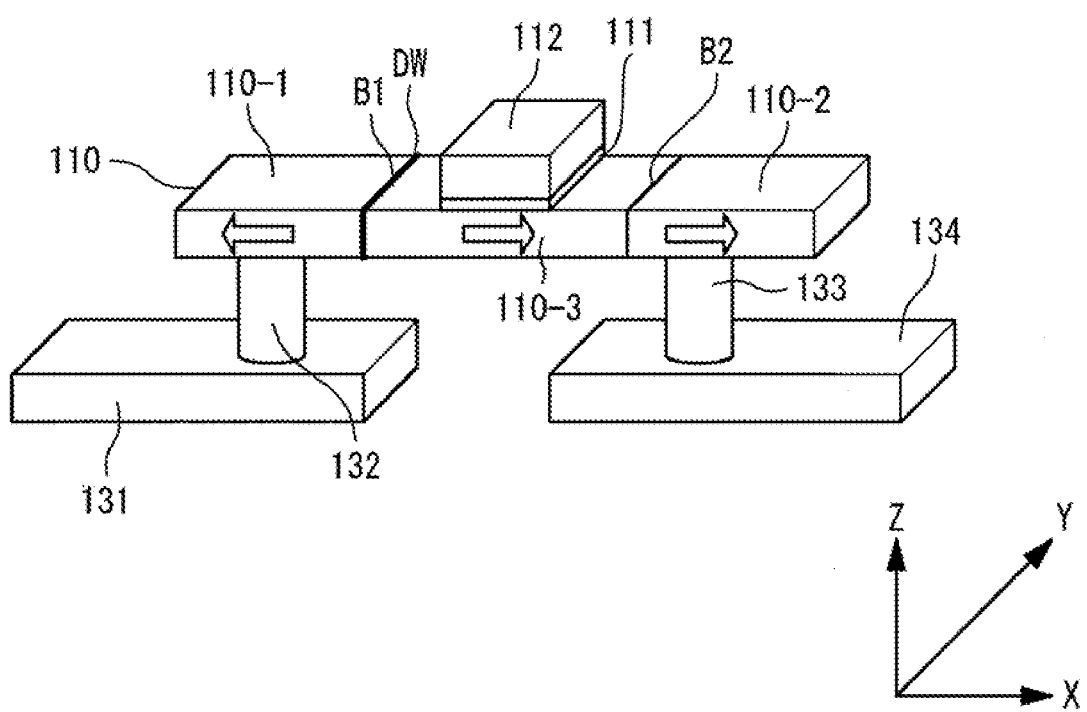
FIG. 1 is a schematic view showing a structure of a magnetoresistance effect element in a typical domain wall motion type MRAM.
Figure 4:
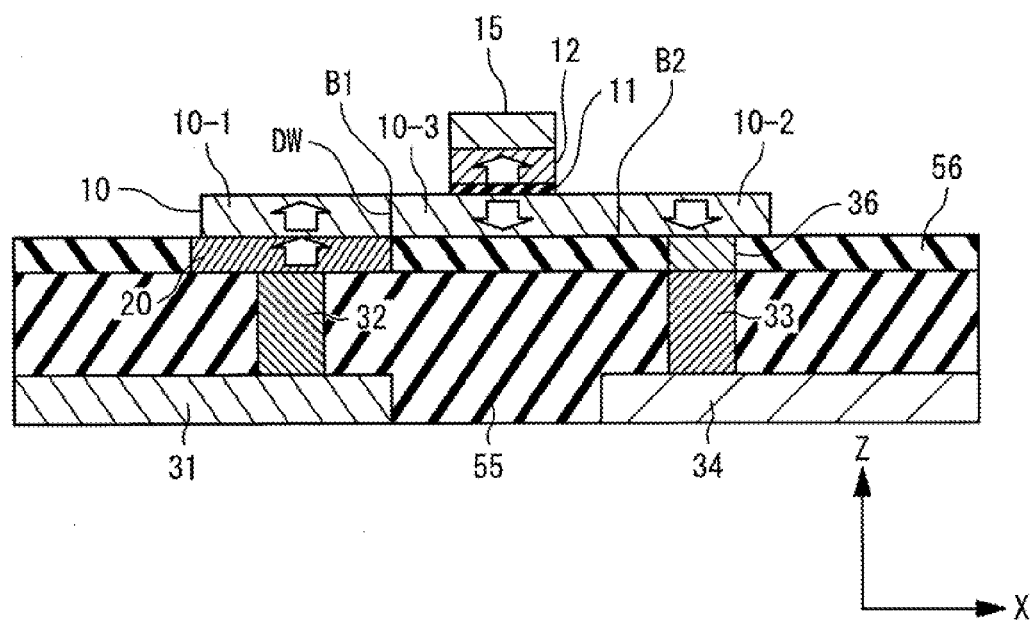
FIG. 4 is a cross-sectional view showing a structure of the memory element part in the first exemplary embodiment.

In the case of the domain wall motion type MRAM, respective magnetizations of different regions within the same magnetic recording layer are required to be fixed in the opposite directions, as shown in FIGS. 1, 3 and 4. In the example shown in FIGS. 3 and 4, the magnetization direction of the first magnetization fixed region 10-1 is fixed in the +Z-direction while the magnetization direction of the second magnetization fixed region 10-2 is fixed in the −Z-direction.

It may be considered as one method of fixing the magnetization directions of the respective magnetization fixed regions 10-1 and 10-2 to provide the magnetic coupling layer 20 for each of the magnetization fixed regions 10-1 and 10-2. In this case, the magnetization directions of the respective magnetic coupling layers 20 are required to be opposite to each other.

In order to fix (initialize) the magnetization direction of the magnetic coupling layer 20, it is generally necessary to perform heat treatment under a condition that an external magnetic field is applied in a predetermined direction. In order to fix the respective magnetization directions of the two magnetic coupling layers 20 in the opposite directions, the following processes are performed. First, the magnetization of one of the magnetic coupling layers 20 is initialized by using a strong external magnetic field in a certain direction. After that, the magnetization of the other of the magnetic coupling layers 20 is initialized by using a strong external magnetic field in the opposite direction. At this time, the magnetization direction of the firstly-initialized magnetic coupling layer 20 is disturbed by the heat treatment under the condition that the external magnetic field in the opposite direction is applied.

Besides, other methods such as making a difference in coercivity between the respective magnetic coupling layers 20, using materials having different blocking temperatures and the like can be considered. In either case, however, the fact remains that a strong magnetic field in the opposite direction to the magnetization of the firstly-initialized magnetic coupling layer 20 is applied. This can have no small effect on the firstly-initialized magnetic coupling layer 20.

According to the present exemplary embodiment, one magnetic coupling layer 20 is provided only on the side of one (first magnetization fixed region 10-1) of the two magnetization fixed regions in the magnetic recording layer 10. Therefore, the initialization process of the magnetic coupling layer 20 is performed only once. Since the second initialization process using the external magnetic field in the opposite direction is not performed, the magnetization direction of the magnetic coupling layer 20 is prevented from being disturbed.

After the initialization process of the magnetic coupling layer 20, the process of generating the domain wall DW in the magnetic recording layer 10 is performed. More specifically, the second external magnetic field is applied in order to reverse the magnetization of the second magnetization fixed region 10-2 and the magnetization switching region 10-3. The magnitude of the second external magnetic field is set to be sufficiently smaller than that required for magnetization reversal of the magnetic coupling layer 20. Moreover, no heat treatment is necessary. Therefore, the application of the second external magnetic field has no influence on the magnetization direction of the magnetic coupling layer 20.

When the second external magnetic field is applied, the magnetization of the first magnetization fixed region 10-1 is not reversed. The reason is that there is magnetic coupling with the magnetic coupling layer 20. That is, it is possible to easily reverse the magnetization of the second magnetization fixed region 10-2 while keeping the magnetization direction of the first magnetization fixed region 10-1. As a result, the magnetization of the first magnetization fixed region 10-1 and the magnetization of the second magnetization fixed region 10-2 are directed to the opposite directions.

According to the present exemplary embodiment, as described above, it is possible to stably and easily set (initialize) the magnetization of the magnetic recording layer 10. The reason is that the magnetic coupling layer 20 is provided only on the side of one magnetization fixed region in the magnetic recording layer 10.

The magnetic coupling layer 20 prevents the domain wall DW from intruding into the first magnetization fixed region 10-1 and also plays a role of stabilizing the fixed magnetization of the first magnetization fixed region 10-1. Alternatively, a notch structure may be formed at a position of the first boundary B1 of the magnetic recording layer 10. In this case, although the notch structure plays a role of holding the domain wall DW at the first boundary B1, the magnetic coupling layer 20 still has the useful function in the above-mentioned magnetization fixation process.

On the other hand, no magnetic coupling layer is provided on the side of the second magnetization fixed region 10-2. However, the fixed magnetization of the second magnetization fixed region 10-2 is stable. The reason is that the shape of the magnetic recording layer 10 is designed such that the current density in the second magnetization fixed region 10-2 becomes smaller than the current density in the magnetization switching region 10-3. It is thus possible to set the magnitude of the write current such that the current density in the magnetization switching region 10-3 becomes higher than the depinning current density and the current density in the second magnetization fixed region 10-2 becomes lower than the depinning current density. In other words, it is possible to set the magnitude of the write current such that the domain wall DW is prevented from intruding into the second magnetization fixed region 10-2 beyond the second boundary. Since the domain wall DW is prevented from intruding into the second magnetization fixed region 10-2, the fixed magnetization of the second magnetization fixed region 10-2 is stabilized. Conversely, there is no need to provide the magnetic coupling layer 20 on the side of the second magnetization fixed region 10-2.

According to the present exemplary embodiment, as described above, it is possible in the domain wall motion type MRAM to easily and stably fix the magnetization. Therefore, production costs are reduced and reliability is improved.

2. Second Exemplary Embodiment

In the second exemplary embodiment, the same reference numerals are given to the same components as those described in the foregoing first exemplary embodiment, and an overlapping description will be omitted as appropriate.

Figure 5:
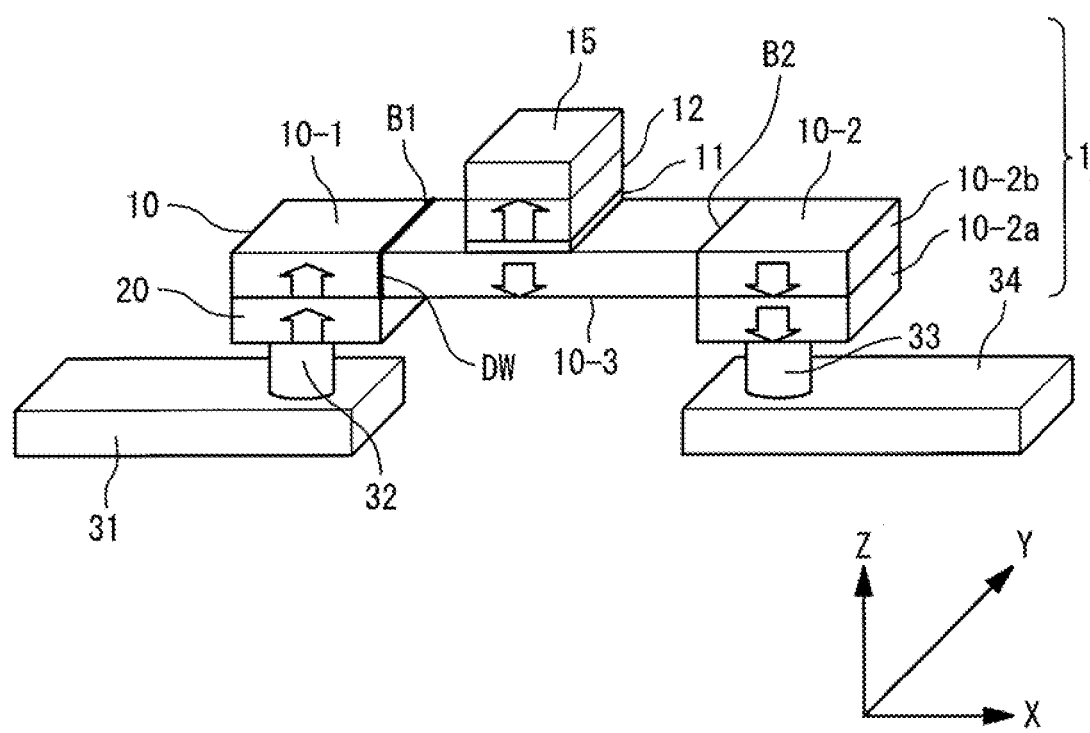
FIG. 5 is a schematic view showing a structure of a memory element part in a second exemplary embodiment.

FIG. 5 shows a structure of the memory element part PM of the MRAM 100 according to the second exemplary embodiment. In the present exemplary embodiment, a thickness (in the Z-direction) of the second magnetization fixed region 10-2 is larger than that of the magnetization switching region 10-3. That is, the cross-sectional area of the second magnetization fixed region 10-2 is larger than the cross-sectional area of the magnetization switching region 10-3 at the second boundary B2. Therefore, as in the case of the first exemplary embodiment, the current density in the second magnetization fixed region 10-2 becomes lower than the current density in the magnetization switching region 10-3.

In the example shown in FIG. 5, the second magnetization fixed region 10-2 can be divided into a lower part 10-2a and an upper part 10-2b formed on the lower part 10-2a. The lower part 10-2a and the upper part 10-2b are made of the same material. A thickness of the lower part 10-2a is substantially equal to a thickness of the magnetic coupling layer 20. A thickness of the upper part 10-2b is substantially equal to the thickness of the first magnetization fixed region 10-1 and the magnetization switching region 10-3. Therefore, a total thickness of the second magnetization fixed region 10-2 is larger than the thickness of the magnetization switching region 10-3.

It should be noted that the thickness of the second magnetization fixed region 10-2 just needs to be larger than the thickness of the magnetization switching region 10-3 at least at the second boundary B2. The thickness of the second magnetization fixed region 10-2 may increase or decrease with increase distance in the X-direction from the second boundary B2. The width of the second magnetization fixed region 10-2 along the Y-axis may be equal to the width of the magnetization switching region 10-3 and the first magnetization fixed region 10-1 along the Y-axis.

Next, a method of manufacturing the structure shown in FIG. 5 will be described with reference to FIG. 6. The first interconnection 31, the second interconnection 34, the first contact 32, the second contact 33 and the magnetic coupling layer 20 are formed as in the case of the first exemplary embodiment. Subsequently, a magnetic film to be the lower part 10-2a of the second magnetization fixed region 10-2 is formed by sputtering or the like. As a result of patterning of the magnetic film by ion milling or the like, the lower part 10-2a is formed in a region where the second magnetization fixed region 10-2 is formed. A position aligned with one end of the lower part 10-2a at this time becomes the second boundary B2 in the magnetic recording layer 10.

Next, an insulating layer 56 such as an $SiO_2$ film is deposited. Subsequently, the insulating layer 56 over the magnetic coupling layer 20 and the lower part 10-2a is completely removed by CMP. After that, the magnetic recording layer 10, the tunnel barrier layer 11 and the pinned layer 12 are formed in order by sputtering or the like. Then, the pinned layer 12, the tunnel barrier layer 11 and the magnetic recording layer 10 are processed by ion milling or the like to be respective desired shapes. In this manner, it is possible to effectively increase the film thickness of the second magnetization fixed region 10-2 of the magnetic recording layer 10.

The method of fixing the magnetizations of the magnetization fixed regions (10-1, 10-2) in the magnetic recording layer 10 is the same as in the first case of the exemplary embodiment. The data write operation and the data read operation are the same as in the case of the first exemplary embodiment.

Figure 6:
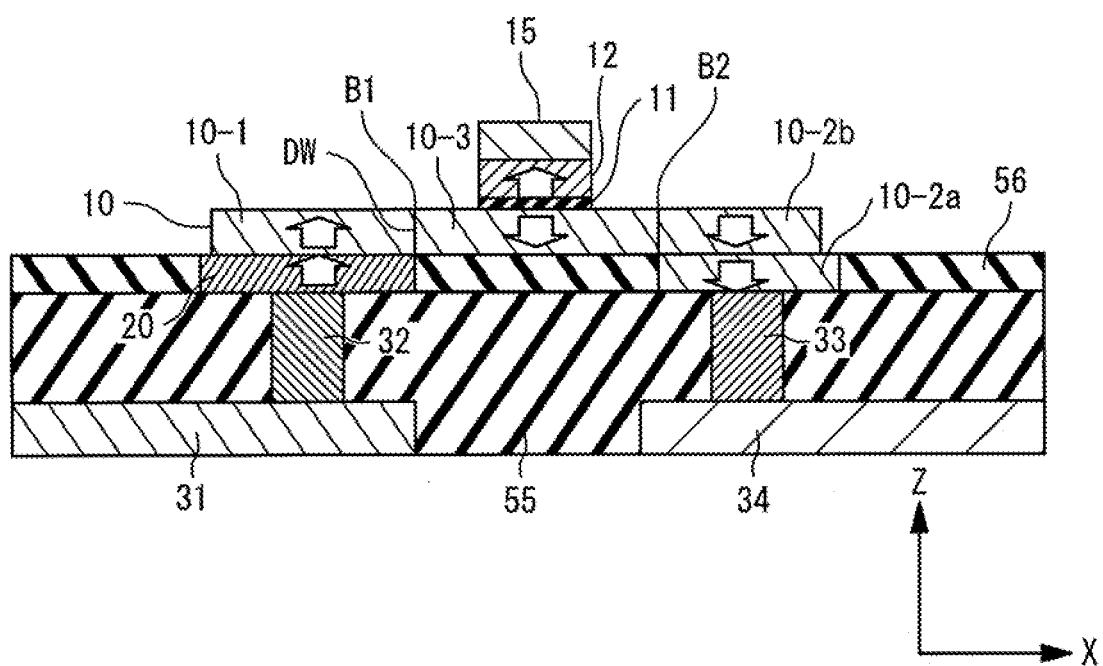
FIG. 6 is a cross-sectional view showing a structure of the memory element part in the second exemplary embodiment.

The same effects as in the first exemplary embodiment can be obtained by the structure shown in FIGS. 5 and 6.

3. Third Exemplary Embodiment

In the third exemplary embodiment, the same reference numerals are given to the same components as those described in the foregoing first exemplary embodiment, and an overlapping description will be omitted as appropriate.

Figure 7:
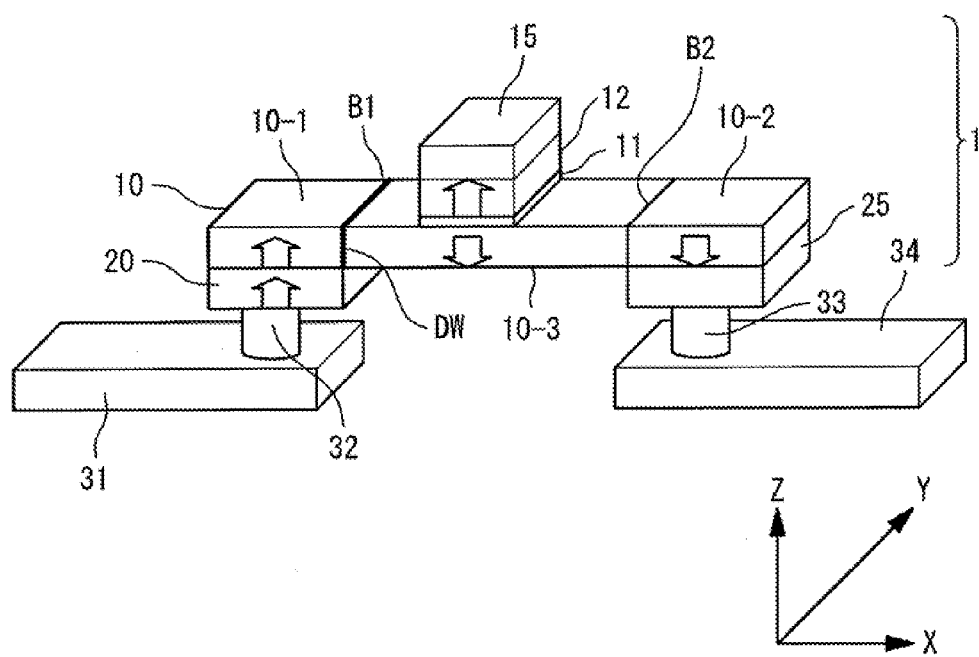
FIG. 7 is a schematic view showing a structure of a memory element part in a third exemplary embodiment.

FIG. 7 shows a structure of the memory element part PM of the MRAM 100 according to the third exemplary embodiment. The memory element part PM according to the present exemplary embodiment has a current divergent layer 25 being a nonmagnetic metal layer, in addition to the above-described configuration. The electric resistivity of the current divergent layer 25 just needs to be not greatly different from that of the magnetic recording layer 10. The current divergent layer 25 is in contact with the second magnetization fixed region 10-2 of the magnetic recording layer 10 and is electrically connected to the second interconnection 34 through the second contact 33. One end of the current divergent layer 25 is adjacent to the second boundary B2. Conversely, a position aligned with the one end of the current divergent layer 25 corresponds to the second boundary B2 in the magnetic recording layer 10.

Therefore, when the current flows between the magnetization switching region 10-3 and the second magnetization fixed region 10-2 through the second boundary B2, the current also flows in the current divergent layer 25 being in contact with the second magnetization fixed region 10-2. As a result, the current density in the second magnetization fixed region 10-2 becomes lower than the current density in the magnetization switching region 10-3, as in the case of the first exemplary embodiment.

Next, a method of manufacturing the structure shown in FIG. 7 will be described with reference to FIG. 8. The first interconnection 31, the second interconnection 34, the first contact 32, the second contact 33 and the magnetic coupling layer 20 are formed as in the case of the first exemplary embodiment. Subsequently, a nonmagnetic metal film to be the current divergent layer 25 is formed by sputtering or the like. As a result of patterning of the nonmagnetic metal film by ion milling or the like, the current divergent layer 25 is formed in a region where the second magnetization fixed region 10-2 is formed. A position aligned with one end of the current divergent layer 25 at this time becomes the second boundary B2 in the magnetic recording layer 10.

Next, an insulating layer 36 such as an $SiO_2$ film is deposited. Subsequently, the insulating layer 56 over the magnetic coupling layer 20 and the current divergent layer 25 is completely removed by CMP. After that, the magnetic recording layer 10, the tunnel barrier layer 11 and the pinned layer 12 are formed in order by sputtering or the like. Then, the pinned layer 12, the tunnel barrier layer 11 and the magnetic recording layer 10 are processed by ion milling or the like to be respective desired shapes. The width and thickness of the second magnetization fixed region 10-2 can be the same of those of the first magnetization fixed region 10-1 and the magnetization switching region 10-3.

The method of fixing the magnetizations of the magnetization fixed regions (10-1, 10-2) in the magnetic recording layer 10 is the same as in the first case of the exemplary embodiment. The data write operation and the data read operation are the same as in the case of the first exemplary embodiment.

Figure 8:
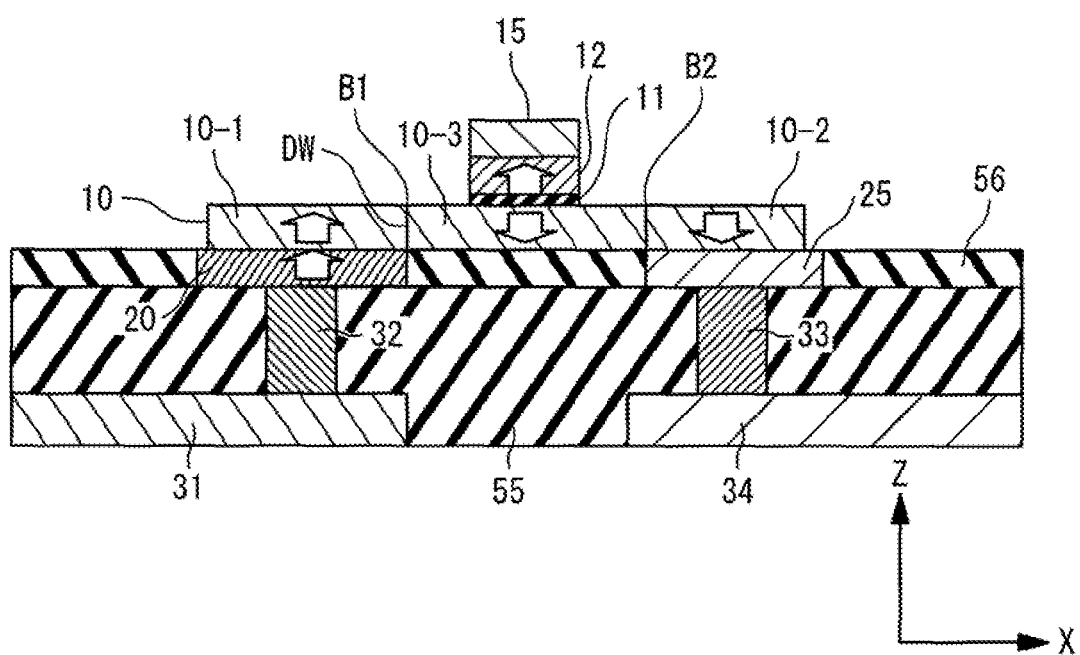
FIG. 8 is a cross-sectional view showing a structure of the memory element part in the third exemplary embodiment.

The same effects as in the first exemplary embodiment can be obtained by the structure shown in FIGS. 7 and 8.

4. Fourth Exemplary Embodiment

In the fourth exemplary embodiment, the same reference numerals are given to the same components as those described in the foregoing exemplary embodiment, and an overlapping description will be omitted as appropriate.

Figure 9:
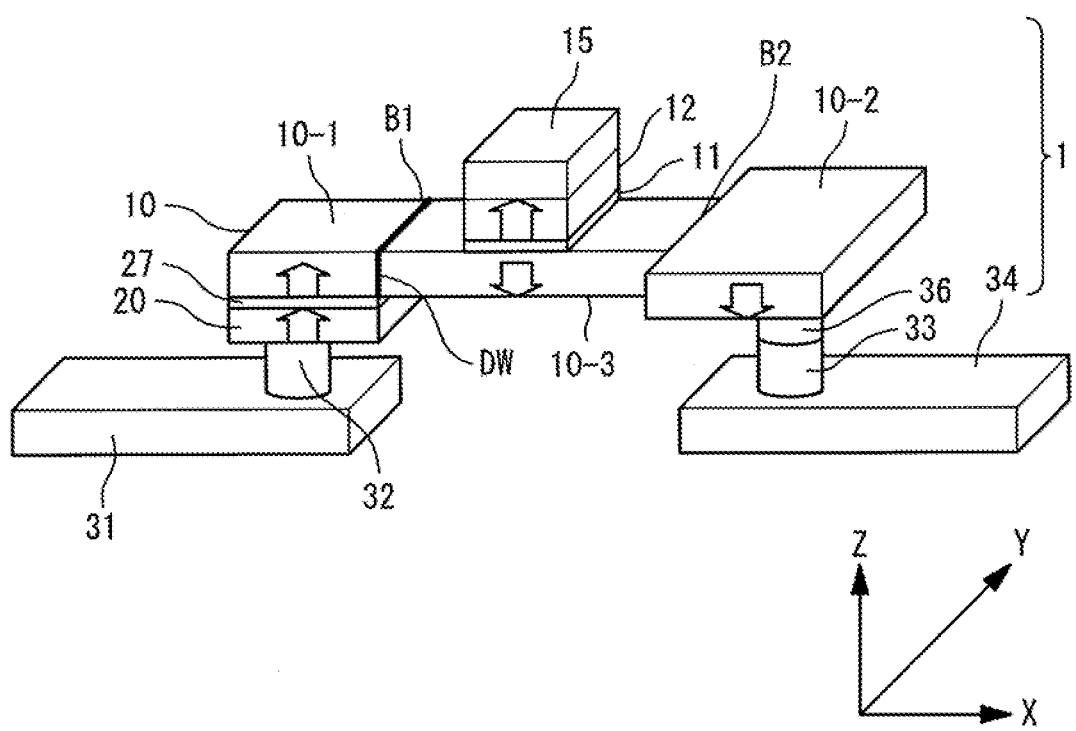
FIG. 9 is a schematic view showing a structure of a memory element part in a fourth exemplary embodiment.

FIG. 9 shows a structure of the memory element part PM of the MRAM 100 according to the fourth exemplary embodiment. The memory element part PM according to the present exemplary embodiment has an intermediate layer 27 formed between the magnetic coupling layer 20 and the magnetic-recording layer 10, in addition to the above-described configuration. In the example shown in FIG. 9, the intermediate layer 27 is sandwiched between the first magnetization fixed region 10-1 and the magnetic coupling layer 20. That is, the magnetic coupling layer 20 is connected to at least the first magnetization fixed region 10-1 through the intermediate layer 27. An $Al_2O_3$ layer being a thin insulating layer or a Ru layer, a Cu layer being a nonmagnetic metal layer can be used as the intermediate layer 27. In either case, the magnetic coupling layer 20 and the first magnetization fixed region 10-1 are magnetically coupled to each other through the intermediate layer 27. As a result, the same effects as in the foregoing exemplary embodiments can be obtained.

Figure 10:
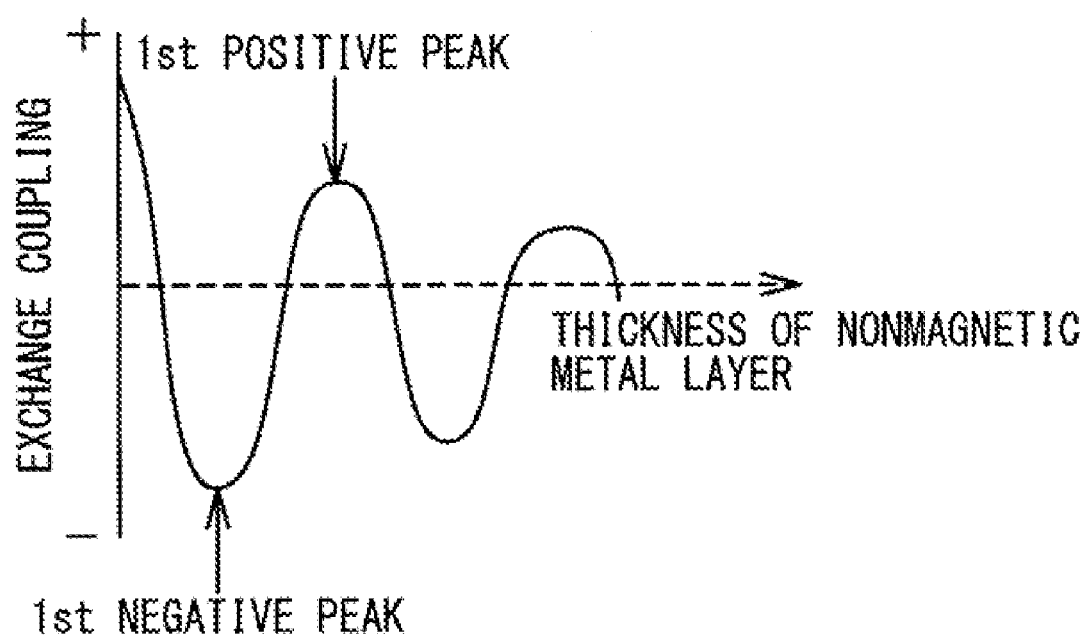
FIG. 10 is a graph showing dependence of strength of exchange magnetic coupling on a thickness of a nonmagnetic metal layer as an intermediate layer.

In a case where the intermediate layer 27 is a nonmagnetic metal layer, the exchange magnetic coupling becomes particularly strong, which is preferable. A graph in FIG. 10 shows dependence of the strength of the exchange magnetic coupling strength on a thickness of the nonmagnetic metal layer (e.g. Ru layer) as the intermediate layer 27. As shown in FIG. 10, the strength of the magnetic coupling varies depending on the thickness of the nonmagnetic metal layer, and property of the magnetic coupling also can be different depending on the thickness of the nonmagnetic metal layer. More specifically, the property of the magnetic coupling varies in an oscillation manner among "ferromagnetic", "zero" and "anti-ferromagnetic".

Figure 11:
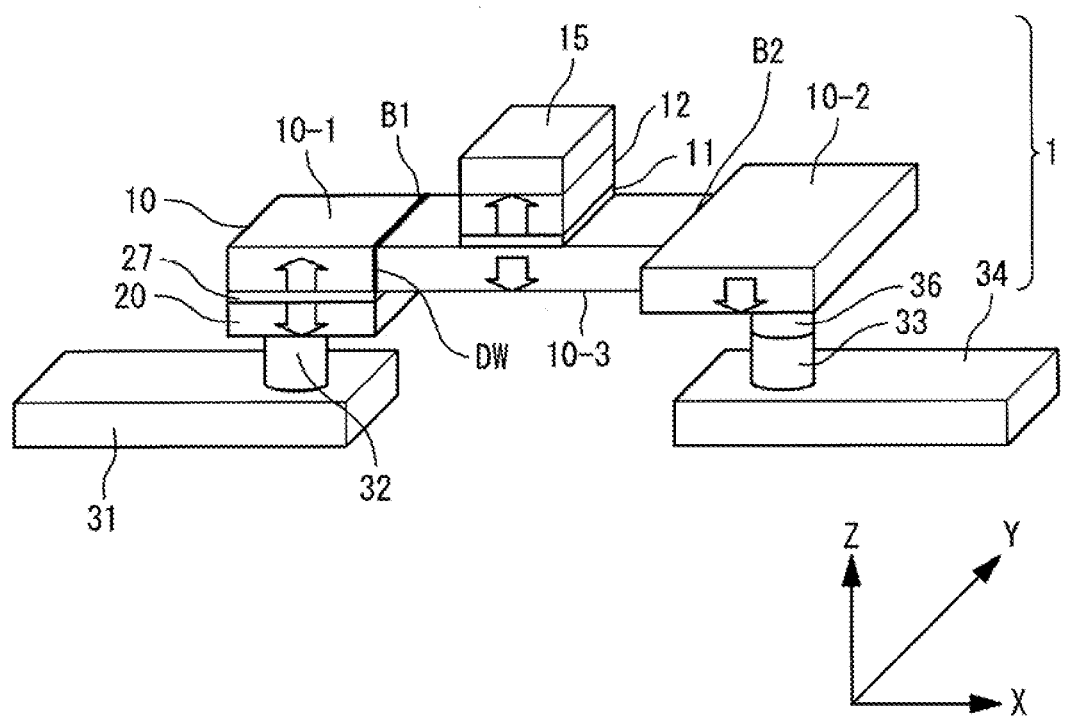
FIG. 11 is a schematic view showing another example of the memory element part in the fourth exemplary embodiment.

Therefore, it is possible to generate very strong ferromagnetic coupling between the magnetic coupling layer 20 and the first magnetization fixed region 10-1 by designing the thickness of the intermediate layer (nonmagnetic metal layer) 27 to be a value corresponding to, for example, the first positive peak in FIG. 10. It is also possible to design the thickness of the intermediate layer 27 to be a value corresponding to, for example, the first negative peak in FIG. 10. In this case, very strong anti-ferromagnetic coupling can be generated between the magnetic coupling layer 20 and the first magnetization fixed region 10-1. FIG. 11 shows a magnetization state of the memory element part PM in this case. Since the magnetic coupling layer 20 and the first magnetization fixed region 10-1 are anti-ferromagnetically coupled to each other, the magnetization directions thereof become opposite to each other as shown in FIG. 11. Even in this case, the fact remains that the magnetization direction of the first magnetization fixed region 10-1 is fixed by the magnetic coupling layer 20.

Figure 12:
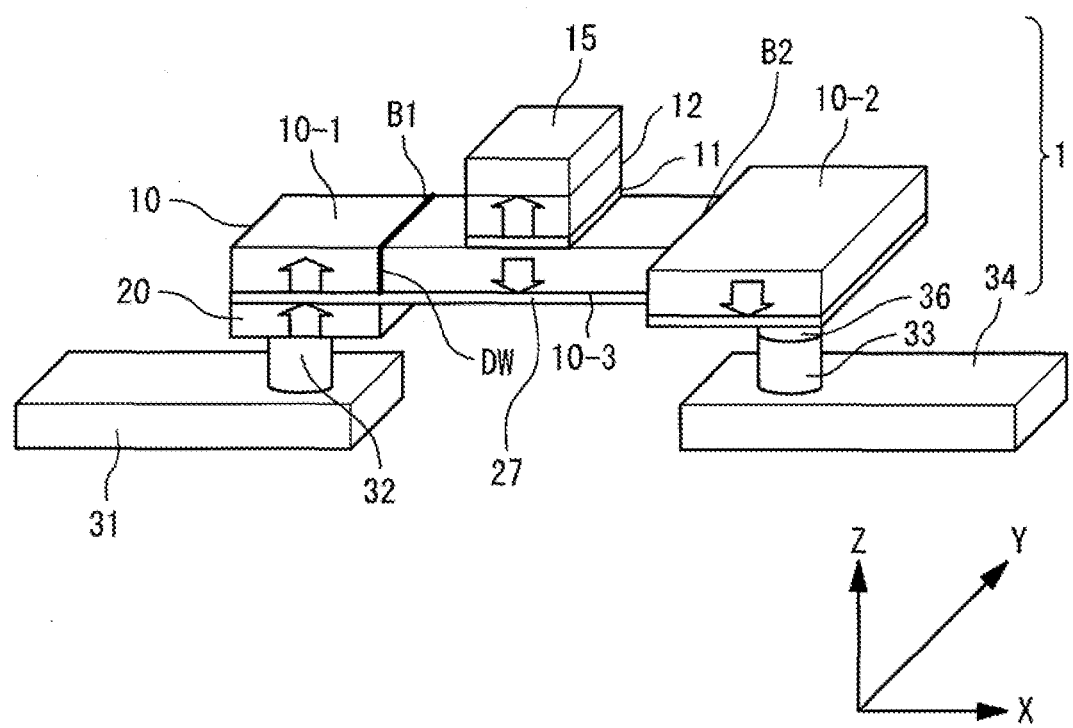
FIG. 12 is a schematic view showing still another example of the memory element part in the fourth exemplary embodiment.

FIG. 12 shows a modification example. In FIG. 12, the intermediate layer 27 is so formed as to be in contact with the whole of the magnetic recording layer 10. In this case, the intermediate layer 27 plays a role of a base layer for the magnetic recording layer 10 as well. By forming the magnetic recording layer 10 on the intermediate layer 27 as the base layer, magnetic property of the magnetic recording layer 10 can be improved, which is preferable.

A method of manufacturing the structure in the present exemplary embodiment is the same as in the foregoing exemplary embodiments, except that a process of forming the intermediate layer 27 is added. That is, the intermediate layer 27 is so formed as to be in contact with the magnetic coupling layer 20. As described above, the material, film thickness and shape of the intermediate layer 27 can be designed as appropriate. Furthermore, the magnetic recording layer 10 is formed such that at least the first magnetization fixed region 10-1 is in contact with the intermediate layer 27. In this manner, the structure exemplified in FIGS. 9, 11 and 12 can be obtained.

It is also possible to magnetically couple the magnetic coupling layer 20 and the first magnetization fixed region 10-1 with each other by using magnetic metal containing Ni, Fe, Co as the intermediate layer 27.

The method of fixing the magnetizations, the data write operation and the data read operation are the same as in the case of the foregoing exemplary embodiments. Also, the fourth exemplary embodiment can be combined with any of the foregoing exemplary embodiments.

5. Perpendicular Magnetic Anisotropy

In the foregoing exemplary embodiments, the magnetic recording layer 10 and the pinned layer 12 each is the perpendicular magnetic film having the perpendicular magnetic anisotropy. However, the present invention is not limited to that. The present invention can also be applied to a case where the magnetic recording layer 10 and the pinned layer 12 each is an in-plane magnetic film having the in-plane magnetic anisotropy (refer to FIG. 1). Even in this case, the magnetic coupling layer 20 is provided on the side of one magnetization fixed region. Also, the current density in the other magnetization fixed region is designed to be smaller than the current density in the magnetization switching region. It is thus possible to easily and stably fix the magnetization in the magnetic recording layer.

Note that, in the case where the magnetic recording layer 10 is the perpendicular magnetic film, the write current required for the domain wall motion can be reduced as compared with a case of in-plane magnetic film. Reduction of the write current is important in the MRAM utilizing the current-driven domain wall motion. For example, electric resistance of ferromagnetic used for the magnetoresistance effect element is higher than that of a typical interconnection, and it is therefore important to reduce the write current from a view point of suppressing heat generation in the element part. The reduction of the write current will be described below in detail.

For example, it is reported that threshold current density at least required for the domain wall motion is about $10^8$ A/cm$^2$ (refer to: Yamaguchi et al., "Real-Space Observation of Current-Driven Domain Wall Motion in Submicron Magnetic Wires", PRL, Vol. 92, pp. 077205-1-4, 2004.). When a width of a layer in which the domain wall motion occurs is 100 nm and its film thickness is 10 nm, the minimum required magnitude of the write current is 1 mA. In order to further reduce the write current, the film thickness may be made smaller. However, it is also reported that the threshold current density required for the domain wall motion increases as the film thickness becomes smaller (refer to: Yamaguchi et al., "Reduction of Threshold Current Density for Current-Driven Domain Wall Motion using Shape Control", Japanese Journal of Applied Physics, vol. 45, No. 5A, pp. 3850-3853, 2006.).

Behavior of local magnetization of magnetic body when the spin-polarized current is taken into consideration is represented by the following Equation (1) (refer to: Thiaville et al., "Micromagnetic understanding of current-driven domain wall motion in patterned nanowires", Europhysics Letters, vol. 69, pp. 990-996, 2005).

$$\Delta m = \gamma_0 H \times m + \alpha m \times \Delta m - (u \cdot \nabla) m + \beta m \times [(u \cdot \nabla) m] \quad (1)$$

Here, the m is local magnetic moment, the H is a magnetic field, the $\gamma_0$ is a gyro magnetic constant, the $\alpha$ is Gilbert damping constant, and the $\beta$ is a coefficient of nonadiabatic spin torque term. The u is effective current density and can be represented by the following Equation (2).

$$u = j(P g \mu_B / 2 e M s) \quad (2)$$

Here, the P is spin polarizability, the g is Lande g-factor, the $\mu_B$ is Bohr magneton, the e is elementary charge, and the Ms is saturation magnetization. The j is general current density having dimension of [A/m$^2$]. The effective current density u has dimension of [m/s]. The above-mentioned Equation (1) describes that the time variation in the magnetization m indicated by the left-hand side depends on a plurality of factors indicated by the right-hand side. The part up to the second term in the right-hand side of the Equation (1) is the classic LLG equation. In the right-hand side, the first term represents torque by the magnetic field, the second term represents damping, the third term represents adiabatic spin torque effect, and the fourth term represents nonadiabatic spin torque effect. The second, third and fourth terms are hereinafter referred to as a term, spin torque term and $\beta$ term, respectively.

Figure 13A:
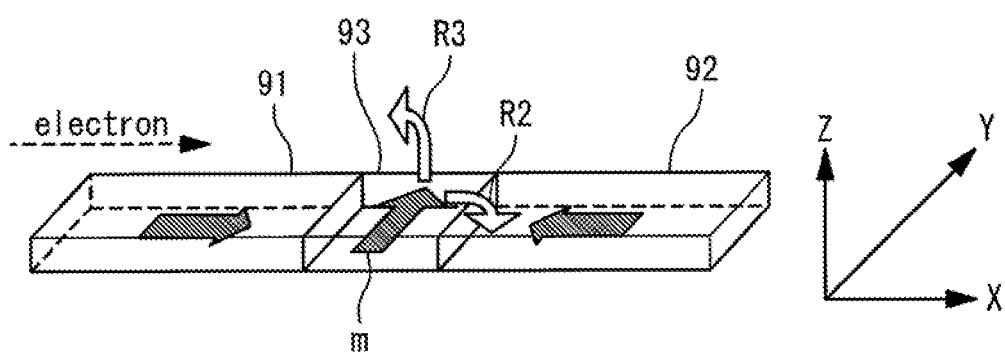
FIG. 13A is a schematic diagram for explaining the domain wall motion in an in-plane magnetic film.

FIG. 13A is a schematic diagram for explaining the domain wall motion in an in-plane magnetic film. The magnetization of a magnetization region 91 is directed to the +X-direction, and the magnetization of a magnetization region 92 is directed to the −X-direction. Therefore, a domain wall 93 is formed between the magnetization region 91 and the magnetization region 92. Let us consider a case where conduction electrons flow in a direction indicated by a dashed arrow in the diagram.

As shown in FIG. 13A, the magnetic moment m in the domain wall 93 tends to rotate in the XY-plane in a rotation direction R2 due to the spin torque term. At the same time, the magnetic moment m tends to rotate in the YZ-plane in a rotation direction R3 due to the $\alpha$ term and the $\beta$ term. The rotation direction is determined depending on magnitude relation between the $\alpha$ term and the $\beta$ term. If the effect by the $\beta$ term is not considered, the rotation direction of the magnetization due to the $\alpha$ term becomes such a direction that counteracts the rotation of the magnetization in the rotation direction R2, namely the domain wall motion. This can also be interpreted as follows. That is, the energy due to the current and the energy generated by the rotation in the rotation direction R3 due to the α term are balanced out, which stops the motion of the domain wall. This balance is disrupted when the effect by the β term is added, and at this time the current-driven domain wall motion is observed (refer to: Thiaville et al., "Micromagnetic understanding of current-driven domain wall motion in patterned nanowires", Europhysics Letters, vol. 69, pp. 990-996, 2005.). That is to say, the domain wall motion in the in-plane magnetic film is "β term driven".

Figure 13B:
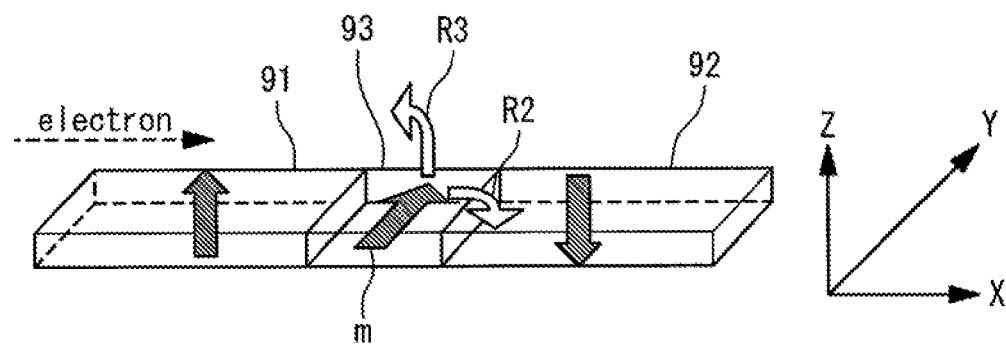
FIG. 13B is a schematic diagram for explaining the domain wall motion in a perpendicular magnetic film.

On the other hand, FIG. 13B is a schematic diagram for explaining the domain wall motion in a perpendicular magnetic film. The magnetization of a magnetization region 91 is directed to the +Z-direction, and the magnetization of a magnetization region 92 is directed to the −Z-direction. Therefore, a domain wall 93 is formed between the magnetization region 91 and the magnetization region 92. Let us consider a case where conduction electrons flow in a direction indicated by a dashed arrow in the diagram.

As shown in FIG. 13B, the magnetic moment m in the domain wall 93 tends to rotate in the YZ-plane in a rotation direction R3 due to the spin torque term. At the same time, the magnetic moment m tends to rotate in the XY-plane in a rotation direction R2 due to the α term and the β term. The rotation direction is determined depending on magnitude relation between the α term and the β term. In the case of the above-mentioned in-plane magnetic film, the rotation direction due to the α term is toward an unstable state in terms of energy, which acts to brake the domain wall motion. In the case of the perpendicular magnetic film, however, when the magnetization rotates in the XY-plane due to the α term, increase in energy is distinctly small as compared with the case of the in-plane magnetic film. Therefore, the magnetic moment m in the domain wall 93 can almost freely rotates in the XY-plane due to the α term and the β term. This scarcely counteracts the rotation in the YZ-plane due to the spin torque term. That is to say, the domain wall motion in the perpendicular magnetic film is "spin torque term driven". In the case of the perpendicular magnetic film, even a minute current enables the domain wall driving due to the spin torque term.

As described above, the domain wall motion in the case of the in-plane magnetic film is β term driven, while the domain wall motion in the case of the perpendicular magnetic film is spin torque term driven. Although the domain wall motion is possible in either case, the spin torque term driven is preferable when depinning the domain wall from a pinning potential. This will be described with reference to FIG. 14.

Figure 14:
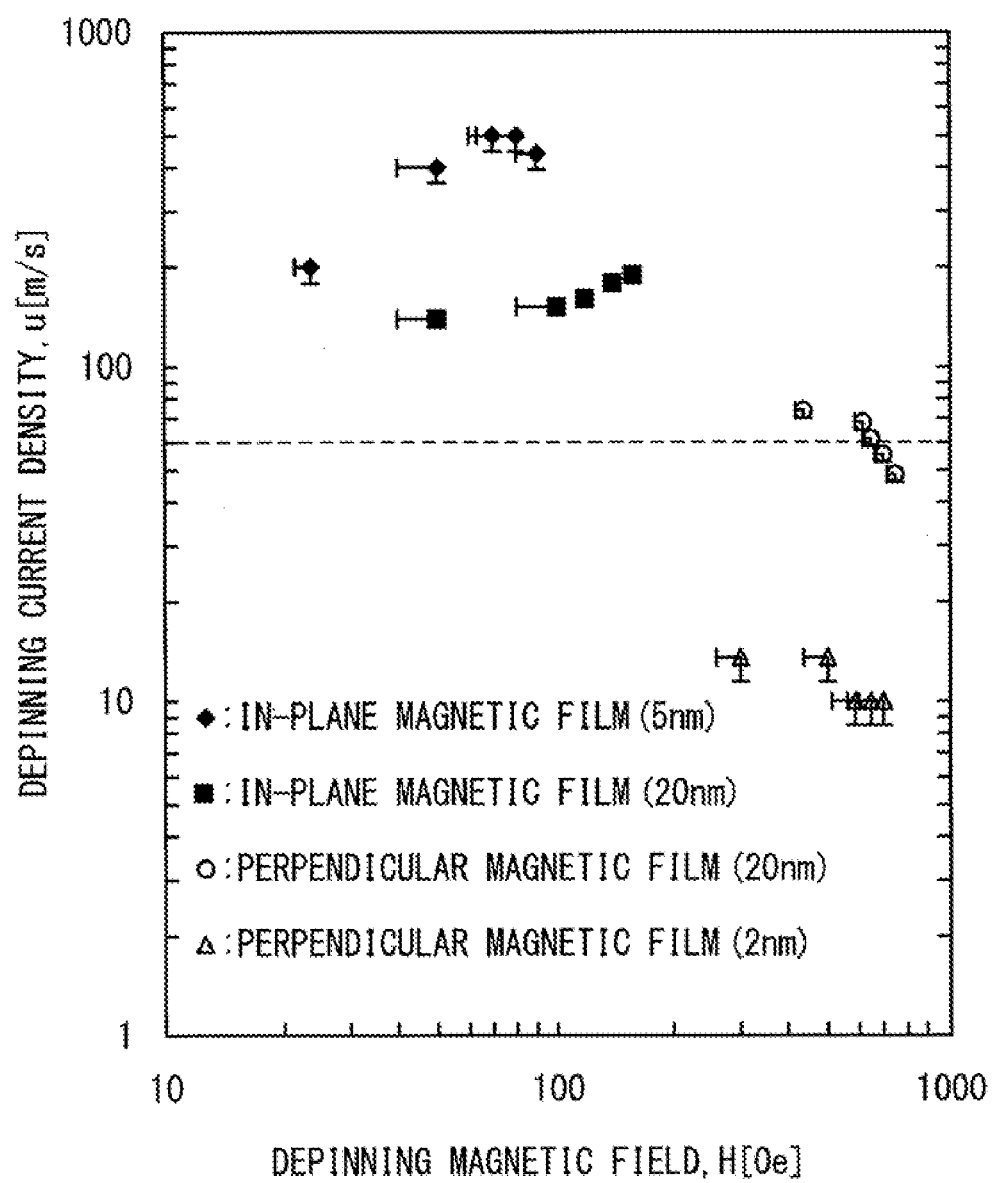
FIG. 14 is a graph showing simulation results of depinning current density and depinning magnetic field required for the domain wall motion.

FIG. 14 shows the depinning magnetic field H and the effective depinning current density u required for depinning the domain wall from a pinning potential. The depinning magnetic field H and the effective depinning current density u are calculated by micromagnetic simulation based on the above-described Equation (1). The pinning potential is set by providing the element with five kinds of notches having different sizes. Shown in FIG. 14 are calculation results in cases of the in-plane magnetic film having the film thickness of 5 nm and 20 nm and in cases of the perpendicular magnetic film having the film thickness of 2 nm and 20 nm.

As shown in FIG. 14, in the case of the perpendicular magnetic film, the depinning magnetic field H is about one digit larger and the depinning current density u is about one digit smaller as compared with the case of the in-plane magnetic film. This means that thermal stability and disturbance magnetic field tolerance (disturbance tolerance) are improved and the write current is reduced in the case of the perpendicular magnetic film.

Also, a level where the effective depinning current density u is 60 [m/s] is indicated by a dotted line in FIG. 14. The level indicated by the dotted line corresponds to a case where the current density j is $1 \times 10^8$ [A/cm$^2$] when $M_S$=500 [emu/cm$^3$] and P=0.5. If the current density j becomes higher than $1 \times 10^8$ [A/cm$^2$], influence of heat generation becomes conspicuous. Moreover, there is concern that electromigration may be caused. It is therefore preferable to perform the data write operation with the current density j equal to or lower than about $1 \times 10^8$ [A/cm$^2$].

As shown in FIG. 14, in the case of the perpendicular magnetic film having the film thickness of 20 nm, the effective depinning current density u is distributed around the dotted line. When the film thickness is decreased further, the depinning is possible with further lower current density. It is therefore preferable that the magnetic recording layer 10 is the perpendicular magnetic film and its film thickness is equal to or less than 20 nm. More preferably, the film thickness of the perpendicular magnetic film is equal to or less than 10 nm. The lower limit of the film thickness is about 1 nm. The reason is that the perpendicular magnetization cannot be maintained stably at room temperature if the film thickness becomes lower than about 1 nm (refer to: Imada et al., "Perpendicular magnetization of L1$_0$-ordered FePt films in the thinnest limit", Applied Physics Letters, vol. 90, pp. 132507, 2007).

When the film thickness becomes smaller, not only the depinning current density u is lowered but also a total current amount depending on product of the film thickness and the current density is reduced. That is, the total current is greatly reduced as the film thickness becomes smaller. In the above-mentioned case where the width of the magnetic recording layer is 100 nm, its film thickness is 10 nm and the current density j is $1 \times 10^8$ [A/cm$^2$], the magnitude of the write current is 1 mA. The current density j can be further lowered by using the perpendicular magnetic film and decreasing its film thickness. As a result, the magnitude of the write current can be greatly reduced from 1 mA.

As is clearly seen from FIG. 14, in the case of the in-plane magnetic film, the depinning current density u is increased as the film thickness becomes smaller, which is opposite to the case of the perpendicular magnetic film. In order to lower the depinning current density u, it is necessary to increase the film thickness. It is therefore difficult to reduce the write current in the case of the in-plane magnetization. It can be said that the perpendicular magnetic film has advantage also in this point over the in-plane magnetic film.

As described above, it is preferable to use the perpendicular magnetic film as the magnetic recording layer 10. Thereby, the write current required for the domain wall motion can be greatly reduced. Moreover, heat generation in the magnetoresistance effect element can be suppressed. Furthermore, the thermal stability and disturbance magnetic field tolerance (disturbance tolerance) can be improved.

The exemplary embodiments of the present invention have been described above with reference to the attached drawings. However, the present invention is not limited to the above-described exemplary embodiment and can be appropriately modified by a person skilled in the art without departing from the scope of the invention.

This application is the National Phase of PCT/JP2008/062300, filed Jul. 7, 2008, which is based upon and claims the benefit of priority from Japanese patent application No. 2007-203669, filed on Aug. 3, 2007 and Japanese patent application No. 2007-323296, filed on Dec. 14, 2007, the disclosure of which is incorporated herein in its entirety by reference.

The invention claimed is:

1. A magnetic random access memory of a domain wall motion type, comprising:
 a magnetic recording layer being a ferromagnetic layer and having perpendicular magnetic anisotropy; and
 a magnetic coupling layer being a ferromagnetic layer whose magnetization direction is fixed and having perpendicular magnetic anisotropy,
 wherein said magnetic recording layer comprises:
 a first region that is magnetically coupled to said magnetic coupling layer and whose magnetization direction is fixed in a first direction by said magnetic coupling layer;
 a second region that is not magnetically coupled to said magnetic coupling layer and whose magnetization direction is fixed in a second direction opposite to said first direction; and
 a magnetization switching region connecting between said first region and said second region,
 wherein a cross-sectional area of said second region is larger than a cross-sectional area of said magnetization switching region at a boundary between said second region and said magnetization switching region.

2. The magnetic random access memory according to claim 1,
 wherein a width of said second region is larger than a width of said magnetization switching region at a boundary between said second region and said magnetization switching region.

3. The magnetic random access memory according to claim 1,
 wherein a thickness of said second region is larger than a thickness of said magnetization switching region at a boundary between said second region and said magnetization switching region.

4. The magnetic random access memory according to claim 1, further comprising a nonmagnetic metal layer being in contact with said second region.

5. The magnetic random access memory according to claim 1,
 wherein when a current flows between said second region and said magnetization switching region, the current density in said second region is lower than the current density in said magnetization switching region.

6. The magnetic random access memory according to claim 1,
 wherein said magnetic coupling layer is in contact with said first region.

7. The magnetic random access memory according to claim 1,
 wherein said magnetic coupling layer is connected to at least said first region through an intermediate layer.

8. The magnetic random access memory according to claim 7,
 wherein said intermediate layer is a nonmagnetic metal layer.

9. The magnetic random access memory according to claim 1,
 wherein said magnetic recording layer has perpendicular magnetic anisotropy, and
 said first direction and said second direction are substantially perpendicular to a plane in which said magnetic recording layer is formed.

* * * * *